United States Patent
Wu et al.

[19]

[11] Patent Number: 6,156,642
[45] Date of Patent: Dec. 5, 2000

[54] METHOD OF FABRICATING A DUAL DAMASCENE STRUCTURE IN AN INTEGRATED CIRCUIT

[75] Inventors: Juan-Yuan Wu, Hsinchu; Water Lur, Taipei, both of Taiwan

[73] Assignee: United Microelectronics Corp., Taiwan

[21] Appl. No.: 09/274,603

[22] Filed: Mar. 23, 1999

[51] Int. Cl.⁷ .............................................. H01L 21/4763
[52] U.S. Cl. .......................... 438/637; 438/638; 438/666; 438/669; 438/672; 438/687
[58] Field of Search .................................... 438/637, 638, 438/666, 669, 672, 687

[56] References Cited

U.S. PATENT DOCUMENTS

| | | | |
|---|---|---|---|
| 4,833,519 | 5/1989 | Kawano et al. | 257/752 |
| 4,981,550 | 1/1991 | Huttemann et al. | 438/672 |
| 5,026,666 | 6/1991 | Hills et al. | 438/301 |
| 5,028,513 | 7/1991 | Murakami et al. | 430/315 |
| 5,099,304 | 3/1992 | Takemura et al. | 257/647 |
| 5,106,781 | 4/1992 | Penning De Vries | 438/645 |
| 5,164,330 | 11/1992 | Davis et al. | 438/654 |
| 5,210,054 | 5/1993 | Ikeda et al. | 438/668 |
| 5,227,337 | 7/1993 | Kadomura | 438/672 |
| 5,231,051 | 7/1993 | Baldi et al. | 438/620 |
| 5,387,550 | 2/1995 | Cheffings et al. | 438/643 |
| 5,861,076 | 8/1999 | Adlam et al. | 156/281 |
| 5,942,449 | 8/1999 | Meikle | 438/747 |
| 5,976,928 | 11/1999 | Kirlin et al. | 438/240 |
| 6,008,140 | 12/1999 | Ye et al. | 438/742 |
| 6,010,603 | 1/2000 | Ye et al. | 204/192.35 |
| 6,037,258 | 3/2000 | Liu et al. | 438/687 |
| 6,037,664 | 3/2000 | Zhao et al. | 257/758 |
| 6,080,529 | 6/2000 | Ye et al. | 430/318 |

*Primary Examiner*—John F. Niebling
*Assistant Examiner*—Lynne Gurley
*Attorney, Agent, or Firm*—Thomas, Kayden, Horstemeyer & Risley, L.L.P.

[57] ABSTRACT

A semiconductor fabrication method is provided for fabricating a dual damascene structure in a semiconductor device. By this method, a dielectric layer is first formed over a semiconductor substrate, and then a void structure including a via hole and a trench is formed in the dielectric layer. Next, a metallization structure is formed in the void structure in the dielectric layer, and after this, a special etching agent is used to treat the exposed surface of the metallization structure so as to make the exposed surface substantially rugged. Finally, a passivation layer is formed over the metallization structure, with the metallization structure serving as the intended dual damascene structure. The roughness of the exposed surface of the metallization structure can help buffer the stresses from the deposition of the passivation layer thereon and also help strengthen the adhesion between the passivation layer and the metallization structure, so that the passivation layer can be firmly secured to the metallization structure. As a result, the passivation layer cannot peel off the metallization structure, and thereby can more reliably help prevent the metallization structure from oxidizing and the atoms/ions in the metallization structure from diffusing into the subsequently formed dielectric layer above the metallization structure. The resultant IC device is therefore more reliable to use.

16 Claims, 4 Drawing Sheets

METHOD OF FABRICATING A DUAL DAMASCENE STRUCTURE IN AN INTEGRATED CIRCUIT

BACKGROUND OF THE INVENTION

1. Field of the Invention

This invention relates to integrated circuit (IC) fabrication technology, and more particularly, to a method of fabricating a dual damascene structure in an IC device having multilevel interconnects.

2. Description of Related Art

In the fabrication of high-density IC devices, RC (resistance-capacitance) content is a major factor that affects the IC performance. The RC content is dependent on the electrical resistance of the metal interconnects in the IC device. Therefore, a metal with a low electrical resistance, such as copper, is preferably utilized to form the metal interconnects in IC devices.

Copper is not only low in electrical resistivity, but it also has high electron mobility and can be fabricated through the industry standard physical vapor deposition (PVD) or Electro-plating deposition or chemical-vapor deposition (CVD) process. Therefore, it is widely used in deep-submicron level IC fabrication. However, although copper has many such benefits, there are still some problems encountered when using copper in IC fabrication. For instance, copper is easily oxidized and eroded when exposed to a humid atmosphere. Moreover, it is difficult to use a dry-etching process for fine pattern definition on a copper-based metallization layer. A further drawback is copper's high diffusion coefficient that causes it to easily diffuse into silicon and form a copper/silicon alloy under low-temperature conditions. Additionally, copper bonds poorly with dielectrics and can easily diffuse through a dielectric layer when subjected to an electric field, thus undesirably resulting in a defect in the semiconductor structure and degradation of the reliability of the resultant IC device.

A solution to the foregoing problems is the use of what is known as a dual damascene structure, which combines a metal plug and an upper level of metallization layer into a single metallization structure in the dielectric layer separating the upper level of metallization layer from the bottom level of metallization layer in the multilevel interconnect structure. A dual damascene structure is conventionally formed by, for example, a first step of forming a dielectric layer over a semiconductor substrate; a second step of forming a combined void structure including a via hole and a trench at predefined locations in the dielectric layer; a third step of depositing metal such as copper into the combined void structure; and a final step of performing a CMP (chemical-mechanical polishing) process to planarize the resultant metallization layer, with the remaining part of the metallization layer serving as the intended dual damascene structure. Since no etching is involved during the foregoing process, the resultant dual damascene structure has enhanced pattern definition. Moreover, copper diffusion is prevented and adhesion between the metallization layer and the dielectric layer is stronger. In addition, a barrier layer is typically formed between the metallization layer and the dielectric layer so as to prevent ion diffusion from the metallization layer to the dielectric layer. Furthermore, a passivation layer is formed over the copper-based metallization layer to prevent the metallization layer from oxidizing.

A conventional method for fabricating a dual damascene structure in an integrated circuit is illustratively depicted in the following with reference to FIGS. 1A–1C.

Referring first to FIG. 1A, the dual damascene structure is constructed on a semiconductor substrate 100. A bottom level metallization layer 102 is formed, preferably from copper, at a predefined location in the substrate 100. Next, a topping layer 104 is formed over the substrate 100, and then a dielectric layer 106 is formed over the topping layer 104. The dielectric layer 106 and the topping layer 104 are selectively removed through a photolithographic and etching process to thereby form a combined void structure including a via hole 110 exposing the bottom level metallization layer 102 and a trench 108 above the via hole 110.

Referring further to FIG. 1B, in the subsequent step, a conformal barrier layer 112 is formed over the wafer in such a manner as to cover all the exposed surfaces of the wafer, including the topmost surface of the dielectric layer 106, the sidewalls of the trench 108 and the via hole 110, and the exposed surface of the bottom level metallization layer 102. Next, a metallization structure 114 is formed by depositing copper into the trench 108 and the via hole 110 and over the top surface of the conformal barrier layer 112.

Referring further to FIG. 1C, in the subsequent step, a chemical-mechanical polishing (CMP) process is performed on the wafer until the topmost surface of the dielectric layer 106 is exposed, whereby the surface parts of the metallization structure 114 and the conformal barrier layer 112 that lie above the topmost surface of the dielectric layer 106 are removed, with the remaining parts thereof planarized. Next, a passivation layer 122 is formed over the entire top surface of the wafer, covering all the exposed surfaces of the dielectric layer 106 and the remaining part of the metallization structure 114. The passivation layer 122 is preferably formed from silicon nitride or silicon carbide through a chemical vapor deposition (CVD) process. This passivation layer 122 can help prevent the metallization structure 114 from oxidizing and also can help prevent the copper atoms/ions in the metallization structure 114 from diffusing into the subsequently formed dielectric layer (not shown) over the metallization structure 114. The remaining part of the metallization structure 114 in the trench 108 and the via hole 110 then serves as the intended dual damascene structure, with the part in the via hole 110 serving as a metal plug and the part in the trench 108 serving as an upper level metallization layer in the multilevel-interconnect structure.

One drawback to the foregoing method, however, is that the use of silicon nitride or silicon carbide to form the passivation layer 122 results in poor adhesion between the passivation layer 122 and the metallization structure 114 due to accumulated stresses from the deposition process, which results in the passivation layer 122 easily peeling off from the top surface of the wafer, as the part indicated by reference numeral 124 in FIG. 1C. The resultant IC device thus has a reliability problem.

SUMMARY OF THE INVENTION

It is therefore an objective of this invention to provide a new method for fabricating a dual damascene structure in an IC device, which can help increase the adhesion strength between the above-mentioned passivation layer and metallization structure, so that the passivation layer can be securely bonded in position over the wafer.

The method of the invention includes the following steps: (1) forming a dielectric layer over the substrate; (2) forming a void structure in the dielectric layer; (3) forming a metallization structure in the void structure in the dielectric layer; (4) treating the exposed surface of the metallization structure with an etching agent so as to make the exposed surface of the metallization structure become substantially rough; and (5) forming a passivation layer over the metallization structure, the metallization structure serving as the intended dual damascene structure.

In the case of the metallization layer being formed from copper, the etching agent can be either HCI or a mixture of HCl, a fluoric-ion equalizer, and a solvent. The fluoric-ion equalizer can be $FeCl_3$ and the solvent is selected from the group consisting of water and $C_2H_5OH$. This etching agent etches the copper grain boundary of the crystalline structure of the metallization structure at a higher rate than the crystalline structure of the same, so that the copper grain boundary is etched away to substantially roughen the exposed surface of the metallization structure. The rough surface of the metallization structure can help buffer the stresses occurring due to the deposition of the passivation layer thereon and also can help strengthen the adhesion between the passivation layer and the metallization structure, so that the passivation layer can be firmly secured to the metallization structure. As a result, the passivation layer cannot peel off the metallization layer, and thereby can more reliably help prevent the metallization structure from oxidizing and the atoms/ions in the metallization structure from diffusing into the subsequently formed dielectric layer above the metallization structure. The resultant IC device is therefore more reliable to use.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new semiconductor fabrication method for fabricating a dual damascene structure in an IC device with multilevel interconnects. However, the invention is not limited to the forming of a dual damascene structure, and can be used to form metal lines, metal plugs, or via windows with the same benefits.

FIGS. 2A–2F are schematic, cross-sectional diagrams used to depict the steps involved in the method according to the invention for fabricating a dual damascene structure in an IC device.

Figure 1A:
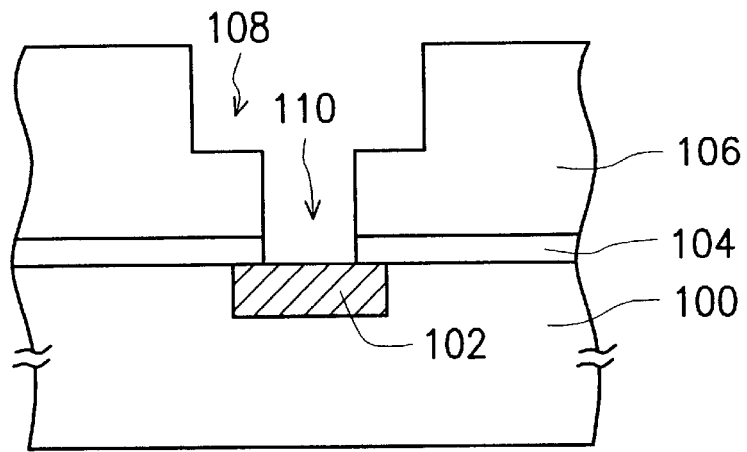
FIGS. 1A–1C are schematic, cross-sectional diagrams used to depict the steps involved in a conventional method for fabricating a dual damascene structure in an IC device.
Figure 1B:
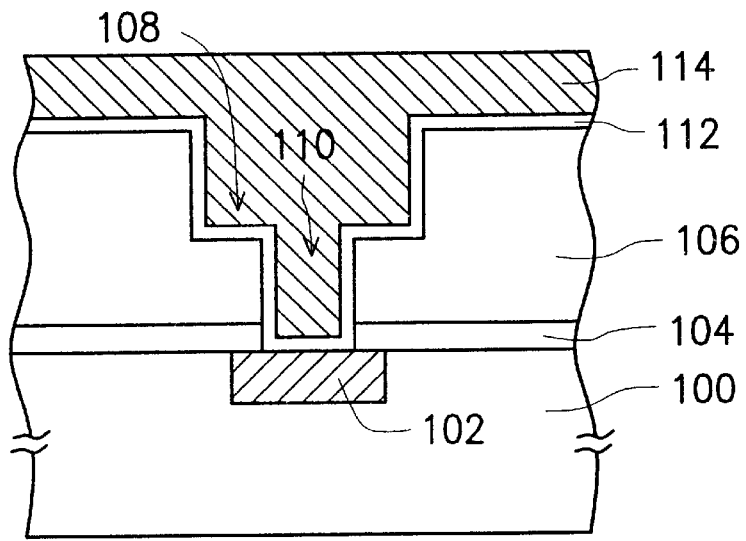
Figure 1C:
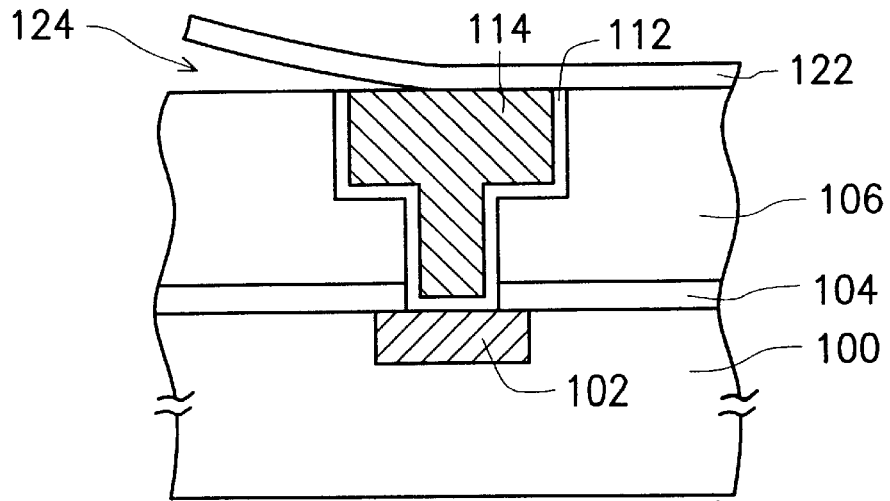
Figure 2A:
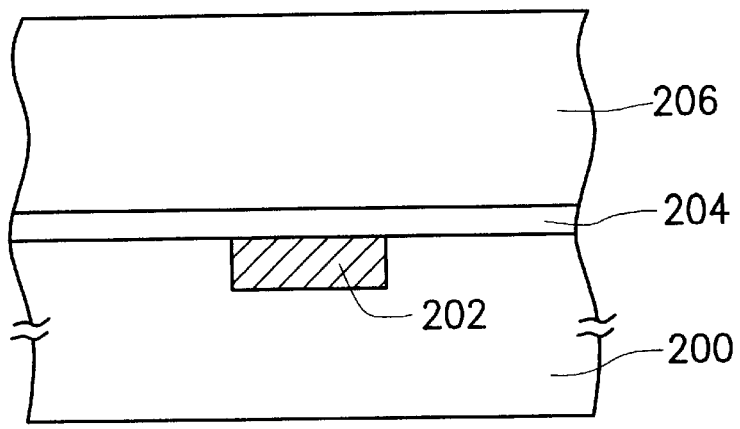
FIGS. 2A–2F are schematic, cross-sectional diagrams used to depict the steps involved in the method according to the invention for fabricating a dual damascene structure in an IC device.

Referring first to FIG. 2A, the dual damascene structure is constructed on a semiconductor substrate 200 which is formed with a bottom level metallization layer 202 and a topping layer 204. Next, a dielectric layer 206 is formed over the topping layer 204. The bottom level metallization layer 202 can be formed, for example, from copper through a CVD process or an electrolytic process to a thickness of from 3,000 Å to 2,000 Å (angstrom). The topping layer 204 is used to prevent the bottom level metallization layer 202 from oxidizing and the atoms/ions in the bottom level metallization layer 202 from diffusing into the overlying dielectric layer 206. In the case of the bottom level metallization layer 202 being formed from copper, the topping layer 204 is preferably formed from silicon nitride or silicon carbide through a CVD process and to a thickness of from 300 Å to 2,000 Å. Furthermore, the dielectric layer 206 is preferably formed from silicon oxide through a chemical-vapor deposition (CVD) process, or other low k materials, or from a low dielectric-constant spin-on polymer (SOP), such as Flare, SILK, Parylene, or PAE-II, through a spin-coating process.

Figure 2B:
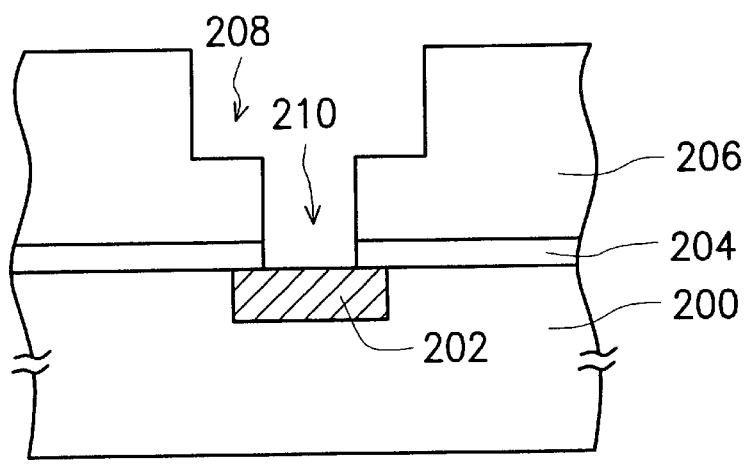

Referring further to FIG. 2B, in the subsequent step, the dielectric layer 206 is selectively removed in such a manner as to form a combined void structure including a via hole 210 and a trench 208 above the via hole 210, whereby the bottom level metallization layer 202 is exposed. This combined void structure of via hole 210 and trench 208 can be formed by, for example, a first step of forming a first photoresist layer (not shown) over the dielectric layer 206, which is then selectively removed to expose a selected part of the dielectric layer 206 that is laid directly above the bottom level metallization layer 202; a second step of etching into the dielectric layer 206 and the topping layer 204 through the first photoresist layer (not shown) until exposing the bottom level metallization layer 202; a third step of removing the first photoresist layer (not shown); a fourth step of forming a second photoresist layer (not shown) over the dielectric layer 206, which is then selectively removed to define the locations where the trench 208 is to be formed; and a fifth step of etching into the dielectric layer 206 through the second photoresist layer (not shown) until reaching a predefined depth.

Figure 2C:
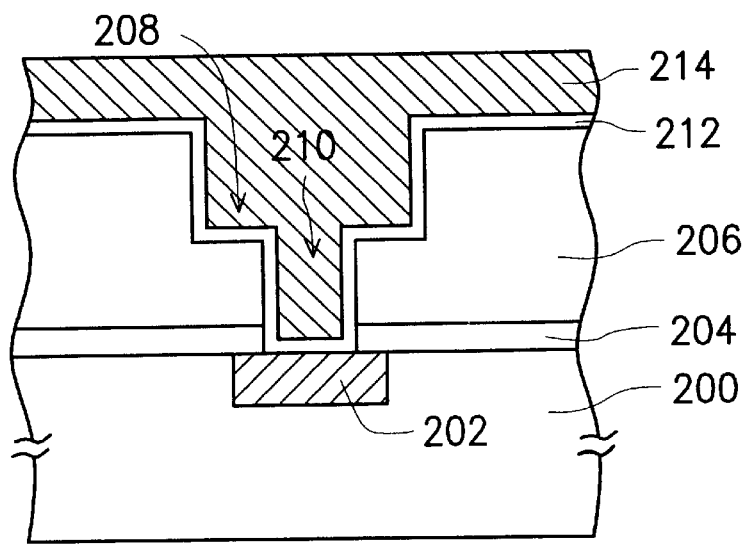

Referring further to FIG. 2C, in the subsequent step, a conformal barrier layer 212 is formed over the wafer in such a manner as to cover all the exposed surfaces of the wafer, including the topmost surface of the dielectric layer 206, the sidewalls of the trench 208 and the via hole 210, and the exposed surface of the bottom level metallization layer 202. The conformal barrier layer 212 is preferably formed from an alloy of titanium and titanium nitride, tantalum, tantalum nitride, or tungsten nitride, through a PVD process or a CVD process. Next, a metallization structure 214 is formed over the wafer by, for example, depositing copper through a PVD process or a CVD process into the trench 208 and the via hole 210 and over the top surface of the conformal barrier layer 212.

Figure 2D:
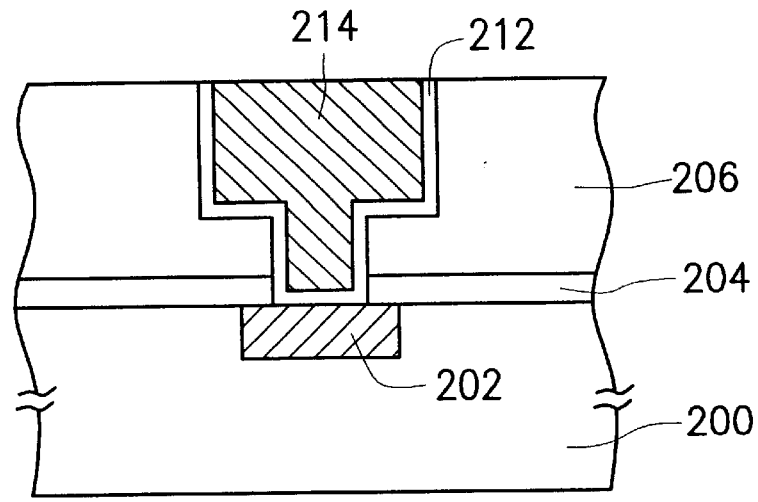

Referring next to FIG. 2D, in the subsequent step, a planarization process, such as a CMP (chemical-mechanical polishing) process, is performed on the wafer until the topmost surface of the dielectric layer 206 is exposed. Through this process, the surface parts of the metallization structure 214 and the conformal barrier layer 212 that lie above the topmost surface of the dielectric layer 206 are removed.

Figure 2E:
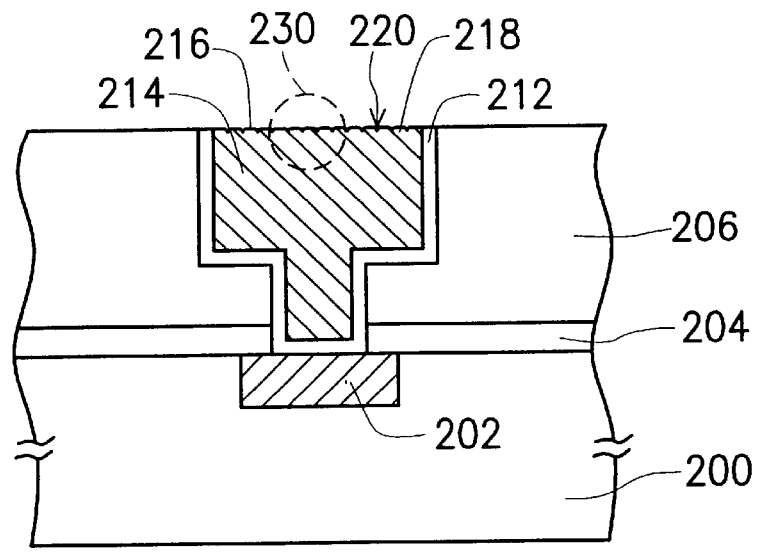
Figure 3:
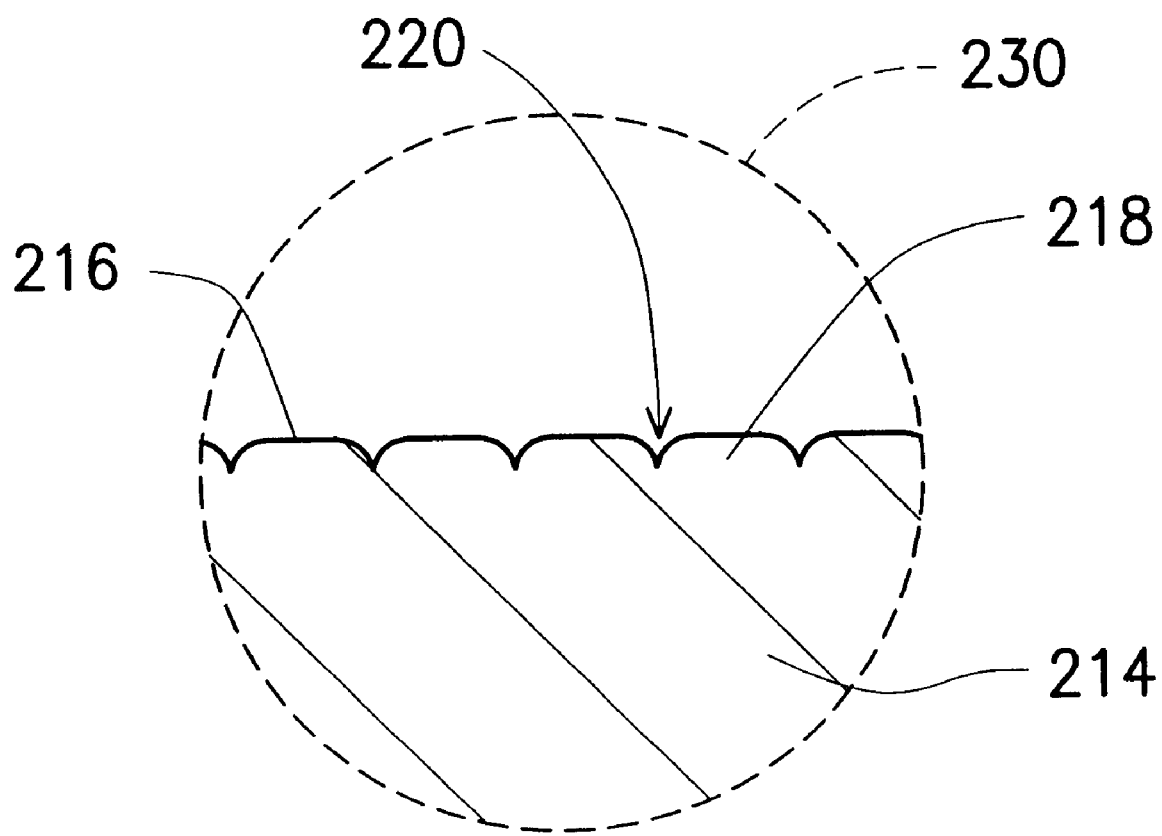
FIG. 3 shows an enlarged view of a part of the surface of the wafer shown in FIG. 2E.

The next step, as illustrated with reference to FIG. 2E, is a characteristic feature of the invention in which a special etching agent is used to treat the exposed surface 216 of the remaining part of the metallization structure 214 so as to roughen the exposed surface 216 of the metallization structure 214. The etching agent can etch away the copper grain boundary 220 in the crystalline structure 218 of the metallization structure 214 so that the exposed surface 216 of the metallization structure 214 is roughened. To better illustrate this effect, an enlarged view of the part within the dashed circle indicated by the reference numeral 230 in FIG. 2E is shown in FIG. 3. In the case of the metallization structure 214 being formed from copper, the etching agent is preferably hydrochloric acid (HCl), or a mixture of HCl, a fluoric-ion equalizer and a solvent. The fluoric-ion equalizer is preferably $FeCl_3$, and the solvent can be either water or $C_2H_5OH$. For example, a 100 g solution of the etching agent can be formed by mixing 5 g of HCl and 5 g of $FeCl_3$ in 90 g of water or $C_2H_5OH$. This etching agent etches the copper grain boundary 220 in the crystalline structure 218 of the metallization structure 214 at a higher rate than it etches the crystalline structure 218, so that the copper grain boundary 220 can be etched away to roughen the exposed surface 216 of the metallization structure 214, as more clearly illustrated in FIG. 3.

Figure 2F:
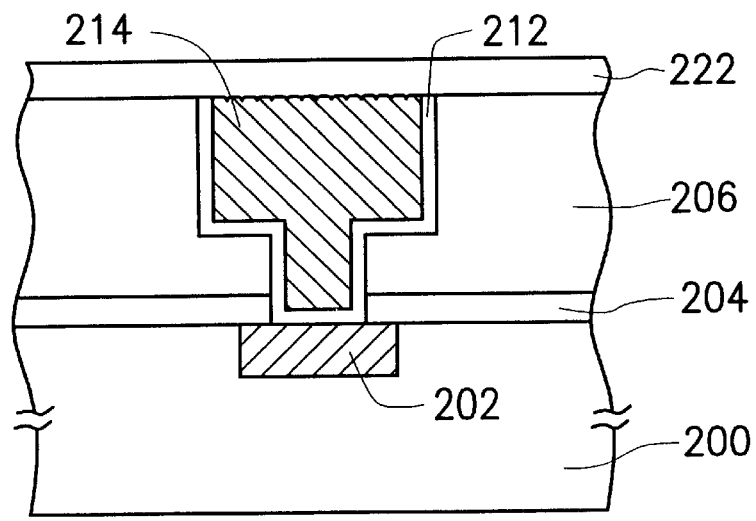

Referring further to FIG. 2F, in the subsequent step, a passivation layer 222 is formed over the entire top surface of the wafer, covering all the exposed surfaces of the dielectric layer 206 and the remaining part of the metallization structure 214 for the purpose of preventing the metallization structure 214 from oxidizing and the atoms/ions in the metallization structure 214 from diffusing into the subsequently formed dielectric layer (not shown) above the metallization structure 214. The passivation layer 222 is preferably formed from silicon nitride or silicon carbide through a CVD process. In conclusion, the remaining part of the metallization structure 214 in the trench 208 and the via hole 210 then serves as the intended dual damascene structure, with the part in the via hole 210 serving as a metal plug and the part in the trench 208 serving as an upper level metallization layer in the multilevel-interconnect structure.

The foregoing method of the invention is more advantageous than the prior art because the exposed surface 216 of the metallization structure 214 is rough, and can help buffer the stresses from the deposition of the passivation layer 222 thereon and also help increase the adhesion strength between the passivation layer 222 and the metallization structure 214. Therefore, the undesirable peeling of the passivation layer off the metallization structure as seen in the prior art can be here eliminated by utilizing the invention.

In conclusion, the invention provides a new semiconductor fabrication method for fabricating a dual damascene structure in an IC device, which can help buffer the stresses from the deposition of the passivation layer and also help strengthen the adhesion between the passivation layer and the dual damascene structure, so that the passivation layer can be firmly secured to the dual damascene structure. This prevents the passivation layer from peeling off the dual damascene structure, and the passivation layer thereby can more reliably help prevent the dual damascene structure from oxidizing and the atoms/ions in the dual damascene structure from diffusing into the subsequently formed dielectric layer above the dual damascene structure. The resultant IC device is therefore more reliable to use.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a dual damascene structure on a semiconductor substrate, comprising the steps of:

(1) forming a dielectric layer over the substrate;

(2) forming a void structure in the dielectric layer;

(3) forming a metallization structure in the void structure in the dielectric layer;

(4) treating the exposed surface of the metallization structure with an etching agent so as to make the exposed surface of the metallization structure become substantially rough; and (5) forming a passivation layer directly on the substantially rough surface of the metallization structure to prevent peeling of the passivation layer, the metallization structure serving as the intended dual damascene structure.

2. The method of claim 1, wherein the metallization structure is formed from copper.

3. The method of claim 2, wherein the etching agent is HCl.

4. The method of claim 2, wherein the etching agent is a mixture of HCl, a fluoric-ion equalizer, and a solvent.

5. The method of claim 4, wherein the fluoric-ion equalizer is $FeCl_3$ and the solvent is selected from a group consisting of water and $C_2H_5OH$.

6. The method of claim 5, wherein the passivation layer is formed from silicon nitride or silicon carbide.

7. The method of claim 1, wherein the passivation layer is formed from silicon nitride or silicon carbide.

8. A method for fabricating a dual damascene structure on a semiconductor substrate, comprising the steps of:

(1) forming a dielectric layer over the substrate;

(2) forming a void structure in the dielectric layer;

(3) forming a conformal barrier layer on the sidewalls of the void structure in the dielectric layer;

(4) forming a copper-based metallization structure in the void structure in the dielectric layer;

(5) performing a planarization process on the copper-based metallization structure;

(6) treating the exposed surface of the copper-based metallization structure with an etching agent so as to make the exposed surface of the copper-based metallization structure substantially rough; and (7) forming a passivation layer directly on the substantially rough surface of the copper-based metallization structure to prevent peeling of the passivation layer, the metallization structure serving as the intended dual damascene structure.

9. The method of claim 8, wherein the planarization process is a CMP process.

10. The method of claim 9, wherein the etching agent is HCl.

11. The method of claim 9, wherein the etching agent is a mixture of HCl, a fluoric-ion equalizer, and a solvent.

12. The method of claim 8, wherein the etching agent is HCl.

13. The method of claim 8, wherein the etching agent is a mixture of HCl, a fluoric-ion equalizer, and a solvent.

14. The method of claim 13, wherein the fluoric-ion equalizer is $FeCl_3$ and the solvent is selected from a group consisting of water and $C_2H_5OH$.

15. The method of claim 14, wherein the passivation layer is formed from silicon nitride or silicon carbide.

16. The method of claim 8, wherein the passivation layer is formed from silicon nitride or silicon carbide.

* * * * *